US012672460B2

(12) United States Patent
Deng et al.

(10) Patent No.: US 12,672,460 B2
(45) Date of Patent: Jun. 30, 2026

(54) DISPLAY PANEL AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Lei Deng, Beijing (CN); Yue Wei, Beijing (CN); Xia Tang, Beijing (CN); Wei Deng, Beijing (CN); Qian Wang, Beijing (CN); Junxiu Dai, Beijing (CN); Yang Zhou, Beijing (CN); Xin Zhang, Beijing (CN); Yi Qu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 472 days.

(21) Appl. No.: 18/252,315

(22) PCT Filed: Dec. 2, 2020

(86) PCT No.: PCT/CN2020/133432
§ 371 (c)(1),
(2) Date: May 9, 2023

(87) PCT Pub. No.: WO2022/116055
PCT Pub. Date: Jun. 9, 2022

(65) Prior Publication Data
US 2023/0422588 A1     Dec. 28, 2023

(51) Int. Cl.
*H10K 59/40* (2023.01)
*H10K 59/121* (2023.01)
(Continued)

(52) U.S. Cl.
CPC ........... *H10K 59/40* (2023.02); *H10K 59/121* (2023.02); *H10K 59/65* (2023.02); *H10K 59/8731* (2023.02)

(58) Field of Classification Search
CPC ............................. H10K 59/121; H10K 59/65
See application file for complete search history.

(56) References Cited

U.S. PATENT DOCUMENTS

| 10,347,866 | B1 | 7/2019 | Kim |
| 10,541,380 | B1 | 1/2020 | Sung et al. |
| (Continued) | | | |

FOREIGN PATENT DOCUMENTS

| CN | 109032414 A | 12/2018 |
| CN | 110277510 A | 9/2019 |
| | (Continued) | |

OTHER PUBLICATIONS

Korean Office Action, mailed May 30, 2025, from Korean Patent Application No. 10-2023-7013659, 16 pages.
(Continued)

*Primary Examiner* — Daniel P Shook
(74) *Attorney, Agent, or Firm* — Workman Nydegger

(57) ABSTRACT
Provided are a display panel and a display device. The display panel includes: a via hole penetrating through the display panel; a cutting residual area on the periphery of the via hole and includes a base substrate, and a packaging layer: and at least one annular relief structure between the packaging layer and the base substrate in the cutting residual area. The at least one annular relief structure is sequentially distributed around the via hole. At least one relief structure is provided with a surface facing away from the base substrate, and a side face connected to the surface, at least one of the surface and the side face is of a relief shape. The
(Continued)

first relief structure is the relief structure with a smallest distance from the center of the via hole.

16 Claims, 17 Drawing Sheets

(51) Int. Cl.
     *H10K 59/65*          (2023.01)
     *H10K 59/80*          (2023.01)

(56)              References Cited

U.S. PATENT DOCUMENTS

| | | | |
|---|---|---|---|
| 2020/0083475 A1 | 3/2020 | Kang et al. | |
| 2020/0152707 A1 | 5/2020 | Won et al. | |
| 2020/0168683 A1* | 5/2020 | Son | H10K 77/10 |
| 2020/0176520 A1 | 6/2020 | Kim et al. | |
| 2020/0259121 A1 | 8/2020 | Lee et al. | |
| 2021/0096697 A1 | 4/2021 | Do et al. | |
| 2021/0151707 A1 | 5/2021 | Huang et al. | |
| 2021/0193960 A1 | 6/2021 | Song et al. | |
| 2021/0210718 A1* | 7/2021 | Zhang | H10K 59/8731 |
| 2021/0408064 A1 | 12/2021 | Zhang et al. | |
| 2021/0408150 A1 | 12/2021 | Zhang et al. | |
| 2022/0223628 A1 | 7/2022 | Li | |
| 2022/0344619 A1 | 10/2022 | Zhao et al. | |

FOREIGN PATENT DOCUMENTS

| | | |
|---|---|---|
| CN | 110335891 A | 10/2019 |
| CN | 110444683 A | 11/2019 |
| CN | 110620187 A | 12/2019 |
| CN | 110634887 A | 12/2019 |
| CN | 110970576 A | 4/2020 |
| CN | 111258444 A | 6/2020 |
| CN | 111258456 A | 6/2020 |
| CN | 111276507 A | 6/2020 |
| CN | 111564569 A | 8/2020 |
| CN | 111740028 A | 10/2020 |
| CN | 112018045 A | 12/2020 |
| CN | 113345942 A | 9/2021 |
| CN | 113889517 A | 1/2022 |
| KR | 20200030713 A | 3/2020 |
| KR | 20200067576 A | 6/2020 |
| KR | 20200073549 A | 6/2020 |
| WO | 2020191623 A1 | 10/2020 |
| WO | 2020192121 A1 | 10/2020 |

OTHER PUBLICATIONS

Japanese Office Action, mailed Oct. 1, 2024, from Japanese Pat. App. No. 2023-524649, 18 pages.

U.S. Non-Final Office Action, mailed Jul. 17, 2024, from U.S. Appl. No. 18/022,435, 14 pages.

Extended European Search Report, mailed Jul. 5, 2024, from EP Application No. 22868737.2, 11 pages.

International Search Report and Written Opinion, mailed Sep. 3, 2021, from PCT/CN2020/133432, 14 pages.

Extended European Search Report, mailed Oct. 10, 2023, from European Patent App. 20963903.8, 9 pages.

Chinese First Office Action, mailed Mar. 1, 2023, from Chinese Patent App. 202080003174.7, 17 pages.

Chinese Second Office Action, mailed May 26, 2023, from Chinese Patent App. 202080003174.7, 7 pages.

Chinese First Office Action, mailed Aug. 17, 2022, from Chinese Patent App. 202111086347.9, 20 pages.

Chinese Second Office Action, mailed Jun. 1, 2023, from Chinese Patent App. 202111086347.9, 10 pages.

Extended European Search Report, mailed Mar. 27, 2026, from EP patent application No. 25226366.0, 10 pages.

\* cited by examiner

T

T

T12

T11

T12

T11

DISPLAY PANEL AND DISPLAY DEVICE

CROSS REFERENCE TO RELATED APPLICATIONS

The present disclosure is a National Stage of International Application No. PCT/CN2020/133432, filed Dec. 2, 2020.

FIELD

The present disclosure relates to the technical field of semiconductors, in particular to a display panel and a display device.

BACKGROUND

Since the emergence of a full screen concept, in order to increase a screen-to-body ratio of a screen, various designs of special-shaped screens have emerged, from notch screens to waterdrop screens, and then to current mainstream hole digging screens. Using a hole digging screen with a small hole diameter can improve use experience of users and bring a better sense of immersion. Among them, the waterdrop screen is an upgraded version of the notch screen. Compared to a notch screen, a waterdrop screen has a smaller incision, usually leaving only a small protrusion at the top of the screen, which looks like a drop of water is falling on the screen, hence the name "waterdrop screen". The hole digging screen is a screen with a camera hole in the substrate (such as, glass cover plate, liquid crystal layer, and backlight layer, etc.).

SUMMARY

An embodiment of the present disclosure provides a display panel, including:

a via hole, penetrating through the display panel;

a cutting residual region, located on a periphery of the via hole and including: a base substrate, and a packaging layer on a side of the base substrate; and at least one circle of relief structure, arranged between the packaging layer and the base substrate in the cutting residual region;

where the at least one circle of relief structure is sequentially distributed around the via hole; a smallest distance between a first relief structure and an outer edge of the via hole ranges from 0 to 30 micrometers; at least one relief structure is provided with a surface facing away from the base substrate, and a side face connected to the surface, at least one of the surface or the side face is in a relief shape; and the first relief structure is a relief structure with a smallest distance from a center of the via hole.

In some embodiments, the side face is in the relief shape; and a cross-sectional shape of the relief structure in a direction perpendicular to the base substrate and passing through the center of the via hole includes a T shape.

In some embodiments, the side face is in the relief shape; and a cross-sectional shape of the relief structure in a direction perpendicular to the base substrate and passing through the center of the via hole includes a stepped shape.

In some embodiments, the surface is in the relief shape; and the cross-sectional shape of the relief structure in the direction perpendicular to the base substrate and passing through the center of the via hole includes a U shape.

In some embodiments, in a direction perpendicular to the base substrate, the relief structure includes at least one repetition structure, and the at least one repetition structure is sequentially arranged in a stacked mode.

In some embodiments, the relief structure includes a plurality of repetition structures, and a planarization layer is further arranged between every two adjacent repetition structures.

In some embodiments, cross-sectional shapes of different repetition structures in the direction perpendicular to the base substrate and passing through the center of the via hole are the same.

In some embodiments, the display panel further includes a display region located on a side of the cutting residual region facing away from the via hole, the display region includes a barrier layer, a buffer layer, an active layer, a first gate insulating layer, a first gate metal layer, a second gate insulating layer, a second gate metal layer, an interlayer dielectric layer, a first source-drain layer, a first planarization layer, a second source-drain layer, a second planarization layer and a pixel defining layer which are sequentially located on one side of the base substrate.

In some embodiments, the relief structure is composed of one or a combination of the barrier layer, the buffer layer, the first gate insulating layer, the second gate insulating layer, the interlayer dielectric layer, the first planarization layer, the second planarization layer and the pixel defining layer.

In some embodiments, a plurality of circles of first crack dams are further arranged on one side of the relief structure facing away from the via hole, the first crack dams are arranged between the base substrate and the packaging layer, and the plurality of circles of first crack dams are sequentially arranged around the relief structure.

In some embodiments, a first anti-crack metal layer is further arranged between the at least one first crack dam and the base substrate, and a second anti-crack metal layer is further arranged between the first anti-crack metal layer and the first crack dam.

In some embodiments, the first anti-crack metal layer and the first gate metal layer are on the same layer, and the second anti-crack metal layer and the second gate metal layer are on the same layer.

In some embodiments, a third anti-crack metal layer is further arranged between the at least one relief structure and the base substrate, and a fourth anti-crack metal layer is further arranged between the third anti-crack metal layer and the relief structure; and the third anti-crack metal layer and the first anti-crack metal layer are on the same layer, and the fourth anti-crack metal layer and the second anti-crack metal layer are on the same layer.

In some embodiments, a distance between two adjacent circles of relief structures is greater than a distance between two adjacent circles of first crack dams.

In some embodiments, the distance between two adjacent circles of relief structures is twice the distance between two adjacent circles of first crack dams.

In some embodiments, two adjacent circles of relief structures have a groove therebetween, and the groove extends from the packaging layer to the buffer layer and exposes part of the buffer layer.

In some embodiments, a plurality of circles of flow stop dams sequentially surrounding the first crack dams are further arranged on a side of the first crack dams facing away from the relief structure, and in a direction from the flow stop dams pointing to the via hole, a height of each circle of flow stop dam in the direction perpendicular to the base substrate sequentially increases.

In some embodiments, a plurality of circles of second crack dams sequentially surrounding the flow stop dams are further arranged on a side of the flow stop dams facing away from the first crack dams; and the second crack dams are the same as the first crack dams in composition.

In some embodiments, the display panel includes 3 relief structures, 5 first crack dams, 2 flow stop dams and 4 second crack dams.

In some embodiments, the display panel further includes a half-relief structure, and the half-relief structure is located between the relief structure and the via hole.

In some embodiments, cross-sectional largest widths of different positions of the first relief structure in the direction perpendicular to the base substrate and passing through the center of the via hole are different.

In some embodiments, a smallest distance between the half-relief structure and the outer edge of the via hole is zero.

In some embodiments, a cross-sectional area of the half-relief structure in the direction perpendicular to the base substrate and passing through the center of the via hole is one half of the cross-sectional area of the relief structure in the direction perpendicular to the base substrate and passing through the center of the via hole.

In some embodiments, a smallest distance $k3$ between the first relief structure and the outer edge of the via hole and a smallest distance $k1$ between two adjacent relief structures meet the following relational expression: $0 < k3 \le k1$.

In some embodiments, in the direction perpendicular to the base substrate, the relief structure includes one repetition structure; and the repetition structure and the first source-drain layer are on the same layer, or the repetition structure and the second source-drain layer are on the same layer.

In some embodiments, in the direction perpendicular to the base substrate, the relief structure includes two repetition structures, the two repetition structures are a first repetition structure and a second repetition structure located on one side of the first repetition structure facing away from the base substrate respectively; and the first repetition structure and the first source-drain layer are on the same layer, and the second repetition structure and the second source-drain layer are on the same layer.

In some embodiments, in the direction perpendicular to the base substrate, the relief structure includes a first titanium metal layer, an aluminum metal layer and a second titanium metal layer, and the first titanium metal layer, the aluminum metal layer and the second titanium metal layer are sequentially arranged in a stacked mode, and a line width of the aluminum metal layer is smaller than a line width of the second titanium metal layer.

In some embodiments, each relief structure is an integrated structure.

In some embodiments, each relief structure includes a plurality of entity parts and a plurality of excavation parts, and the entity parts and the excavation parts are arranged alternately; and all the entity parts in the same relief structure have the same center of circle.

In some embodiments, the packaging layer of the cutting residual region includes a first inorganic packaging layer and a second inorganic packaging layer located on one side of the first inorganic packaging layer facing away from the base substrate.

An embodiment of the present disclosure further provides a display device, including the display panel provided by the embodiment of the present disclosure.

DETAILED DESCRIPTION OF THE EMBODIMENTS

In order to make objects, technical solutions and advantages of embodiments of the present disclosure clearer, the technical solutions of embodiments of the present disclosure will be clearly and completely described below in conjunction with the accompanying drawings of embodiments of the present disclosure. Apparently, the described embodiments are only a part of embodiments of the present disclosure, not all of embodiments. Based on the described embodiments of the present disclosure, all other embodiments obtained by those ordinarily skilled in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the similar words used in the present disclosure do not indicate any order, quantity or importance, but are merely used to distinguish different components. The words "comprise" or "include" and the like indicate that an element or item appearing before such the word covers listed elements or items appearing after the word and equivalents thereof, and does not exclude other elements or items. The words "connect" or "couple" or the like are not limited to physical or mechanical connection, but may include electrical connection, whether direct or indirect. "Upper", "lower", "left", "right" and the like are only used to represent relative position relationships, and the relative position relationships may also change accordingly after an absolute position of a described object is changed.

In order to keep the following descriptions of the embodiments of the present disclosure clear and concise, detailed descriptions of known functions and known components are omitted in the present disclosure.

Figure 1:
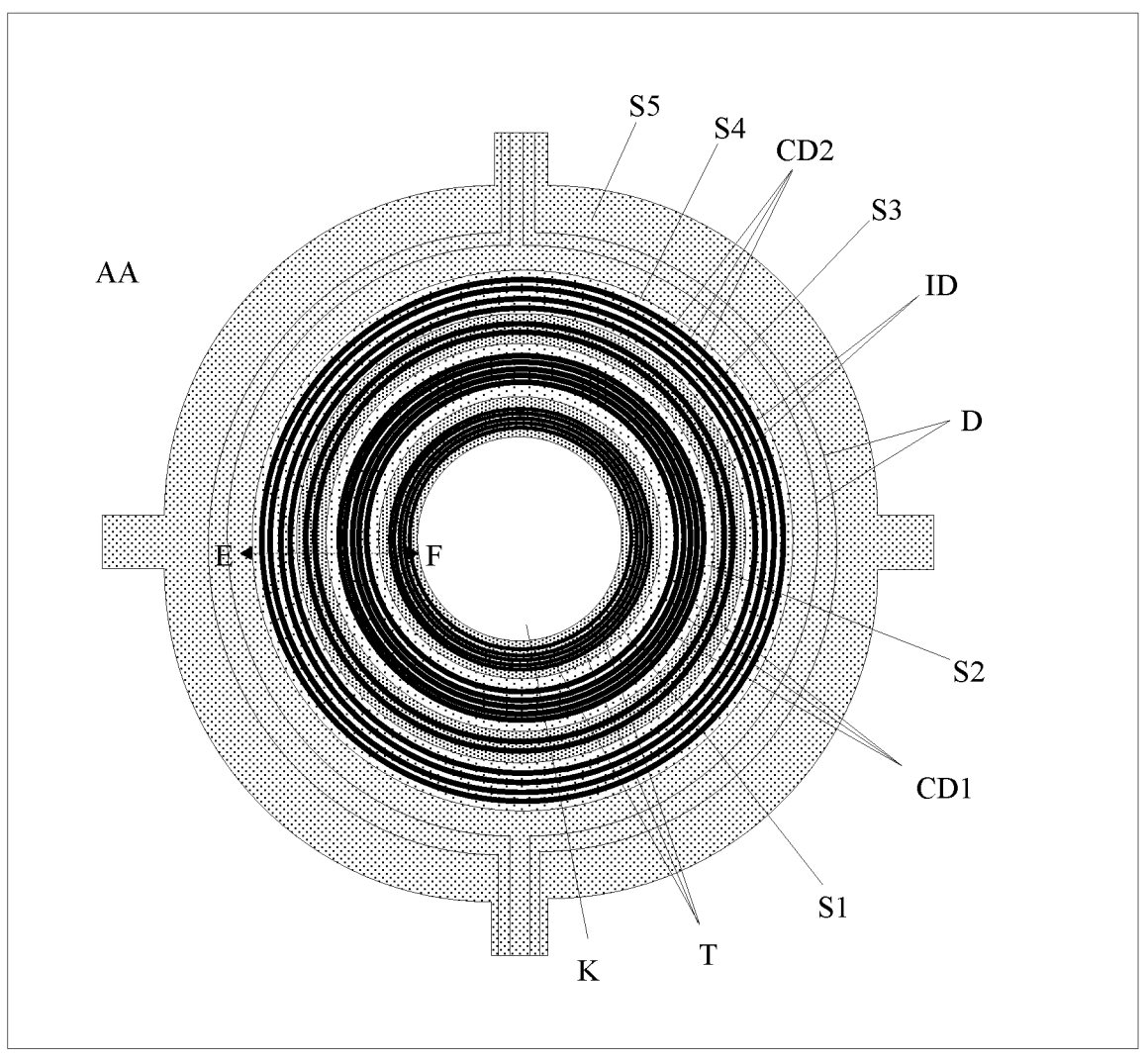
FIG. 1 is a schematic top view of a display panel provided by an embodiment of the present disclosure.
Figure 2:
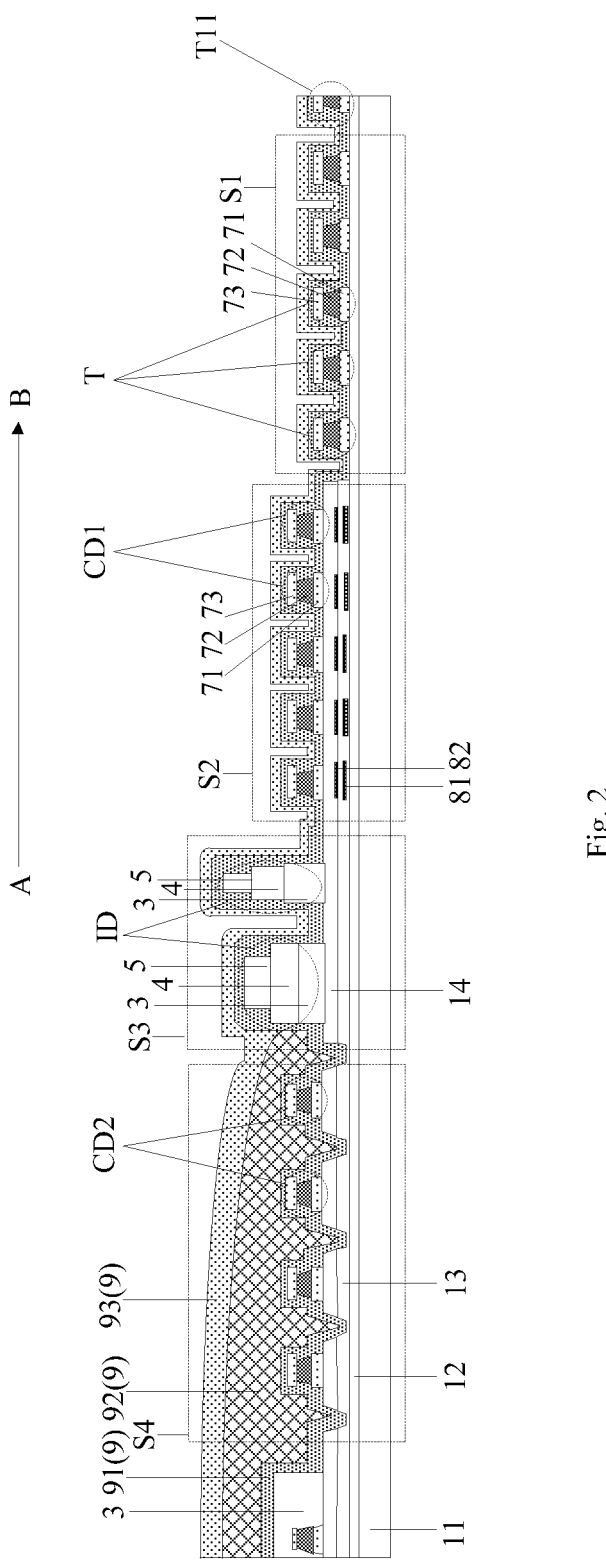
FIG. 2 is a schematic cross-sectional view of FIG. 1 along a dotted line EF.
Figure 3:
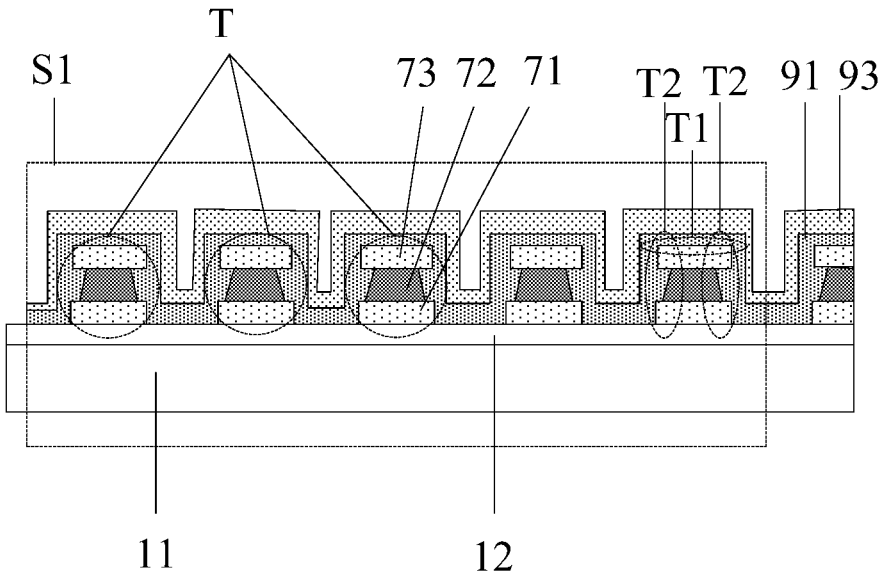
FIG. 3 is an enlarged schematic structural diagram of FIG. 2 in a cutting residual region.
Figure 4A:
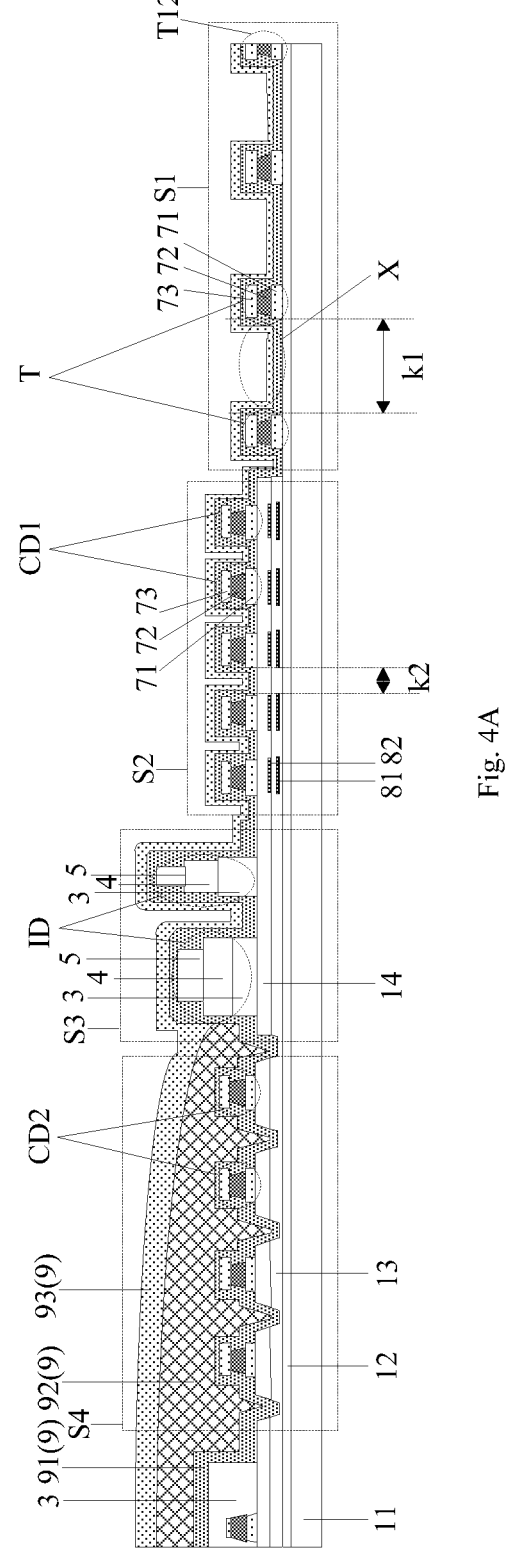
FIG. 4A is a first schematic structural diagram of a distance between every two adjacent relief structures being greater than a distance between every two first crack dams provided by an embodiment of the present disclosure.
Figure 4B:
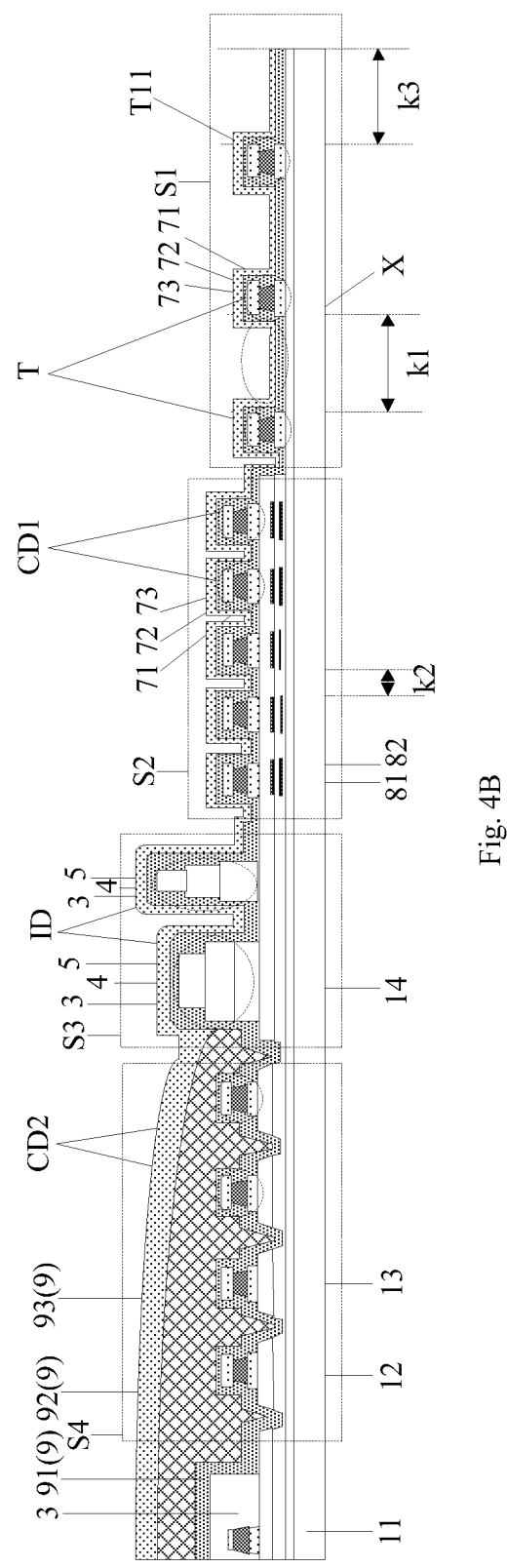
FIG. 4B is a second schematic structural diagram of a distance between every two adjacent relief structures being greater than a distance between every two first crack dams provided by an embodiment of the present disclosure.

Referring to FIG. 1, FIG. 2 and FIG. 3, FIG. 2 is a schematic cross-sectional view of FIG. 1 along a dotted line EF, and FIG. 3 is an enlarged schematic diagram of a cutting residual region S1 in FIG. 2. An embodiment of the present disclosure provides a display panel, including:

a via hole K, penetrating through the display panel, a region where the via hole K is located may be configured to place a camera, and a shape of the via hole K may be a circle, an ellipse or a rectangle;

a cutting residual region S1, located on a periphery of the via hole K and including: a base substrate 11, and a packaging layer 9 located on one side of the base substrate 11, when the via hole K is cut, due to cutting accuracy limitations, the display panel usually needs to arrange a cutting region (not shown in the figure) around the via hole K, and after cutting, a region in the cutting region that is not cut may be used as the cutting residual region ultimately left on the display panel; and at least one circle of relief structure T, arranged between the packaging layer 9 of the cutting residual region S1 and the base substrate 11, where the at least one circle of relief structure T is sequentially distributed around the via hole K, a smallest distance (namely a distance between a position closest to the first relief structure T11 in the outer edge of the via hole K and the first relief structure T11, for example, it may refer to k3 in FIG. 4B) between a first relief structure T11 and an outer edge of the via hole K ranges from 0 to 30 micrometers, at least one relief structure T is provided with a surface T1 facing away from the base substrate 11, and a side face T2 connected to the surface T1, at least one of the surface T1 or the side face T2 is in a relief shape, and the first relief structure T11 is the relief structure T, the distance from which to a center of the via hole K is the smallest.

In some embodiments, when the cut position is just located at a position where the relief structure T is located, the residual half of the relief structure T after cutting is also the first relief structure T11, and at this time, a distance between the first relief structure T11 and the position closest to the outer edge of the via hole K is 0 micrometer.

In the embodiment of the present disclosure, the cutting residual region S1 is provided with at least one circle of relief structure T distributed around the via hole K, at least one of the surface T1 of the relief structure T facing away from the base substrate 11 and the side face T2 is in the relief shape, which may increase a contact area between the relief structure T and the packaging layer 9, enhance a bonding strength of the packaging layer and improve the problems that in a manufacturing process of a hole digging screen, due to stress imbalance of the packaging layer at the cutting region, and a thermal effect generated by laser cutting amplifies the stress, which is prone to causing peeling of the packaging layer, resulting in poor packaging, thereby reducing a production yield of products.

In some embodiments, with reference to FIG. 1 and FIG. 2, the display panel further includes a display region AA located on one side of the cutting residual region S1 facing away from the via hole, and the cutting residual region S1, a first anti-crack region S2, a flow stop region S3, a second anti-crack region S4 and a loop line region S5 may be sequentially arranged between the via hole K and the display region AA. The first anti-crack region S2 may be provided with a plurality of circles of first crack dams CD1 sequentially surrounding the via hole K and configured to prevent cracks generated in a cutting process from extending into the display region and prevent an organic packaging material used in formation of an organic packaging layer 92 from flowing over to the cutting residual region S1. The flow stop region S3 may be provided with a plurality of circles of flow stop dams ID sequentially surrounding the first crack dams CD1 and configured to prevent the organic packaging material used in the formation of the organic packaging layer 92 from flowing over to the cutting residual region S1. The second anti-crack region S4 may be provided with a plurality of circles of second crack dams CD2 sequentially surrounding the flow stop dams ID and configured to prevent the cracks generated in the cutting process from extending to the display region and prevent the organic packaging material used in the formation of the organic packaging layer 92 from flowing over to the cutting residual region S1. The loop line region S5 may be provided with a plurality of signal lines D (for example, the signal lines D may be data lines) avoiding the via hole K and configured to drive a pixel circuit of the display region and write data signals. In some embodiments, the display region AA may include a first inorganic layer 12 (specifically may include a barrier layer and a buffer layer which are sequentially located on the base substrate 11), a second inorganic layer 13 (specifically may include a first gate insulating layer GI1 and a second gate insulating layer GI2 which are sequentially located on the first inorganic layer 12), a third inorganic layer 14 (specifically may include an interlayer dielectric layer ILD located on the second inorganic layer 13), a planarization layer 3, a pixel defining layer 4, a spacer 5, a first inorganic packaging layer 91, an organic packaging layer 92 and a second inorganic packaging layer 93 which are sequentially located on one side of the base substrate 11. The cutting residual region S1, the first anti-crack region S2, the flow stop region S3, the second anti-crack region S4 and the loop line region S5 may be provided with part of the first inorganic layer 12, the second inorganic layer 13, the third inorganic layer 14, the planarization layer 3, the pixel defining layer 4, the spacer 5, the first inorganic packaging layer 91, the organic packaging layer 92 and the second inorganic packaging layer 93. In some embodiments, a light emitting layer (not shown in the figure) may further be arranged between the packaging layer 9 and the pixel defining layer 4, and the light emitting layer may cover the cutting residual region S1, the first anti-crack region S2, the flow stop region S3, the second anti-crack region S4 and the loop line region S5, and be disconnected at the relief structure T, the first crack dam CD1 and the second crack dam CD2.

In some embodiments, with reference to FIG. 1 and FIG. 2, a plurality of circles of first crack dams CD1 are further arranged on one side of the relief structure T facing away from the via hole K, the first crack dams CD1 are located between the base substrate 11 and the packaging layer 9, and the plurality of circles of first crack dams CD1 are sequentially arranged around the relief structure T; and a first anti-crack metal layer 81 is further arranged between each first crack dam CD1 and the base substrate 11, and a second anti-crack metal layer 82 is further arranged between the first anti-crack metal layer 81 and the first crack dam CD1. In the embodiment of the present disclosure, a plurality of circles of first crack dams CD1 are further arranged on one side of the cutting residual region S1 facing away from the via hole K, the plurality of circles of first crack dams CD1 may prevent cracks generated in a cutting process from extending to the display region, moreover, a first anti-crack metal layer 81 is further arranged between each first crack dam CD1 and the base substrate 11, a second anti-crack metal layer 82 is further arranged between the first anti-crack metal layer 81 and the first crack dam CD1, and the first anti-crack metal layer 81 and the second anti-crack metal layer 82 have better ductility, which may better prevent extension of the cracks. In some embodiments, the display panel may further have a first gate metal layer, and a second gate metal layer located on one side of the first gate metal layer facing away from the base substrate 11, the first anti-crack metal layer 81 and the first gate metal layer may be arranged on the same layer and made of the same material, and the second anti-crack metal layer 82 and the second gate metal layer may be arranged on the same layer and made of the same material. In some embodiments, the materials of the first anti-crack metal layer 81 and the second anti-crack metal layer 82 may be molybdenum, since molybdenum has better ductility, it is not prone to breaking in the cutting process, and thus extension of the cracks may be better prevented. In some embodiments, projection patterns of the first anti-crack metal layer 81 and the second anti-crack metal layer 82 on the base substrate 11 may be consistent with projection patterns of the first crack dams CD1 on the base substrate 11, and may be annuli. In some embodiments, the first crack dams CD1 may be the same as the relief structure T in composition, for example, with reference to FIG. 2 or FIG. 4A, the first crack dams CD1 and the relief structure T are all composed of film layers contained in signal lines (such as data lines).

Figure 5A:
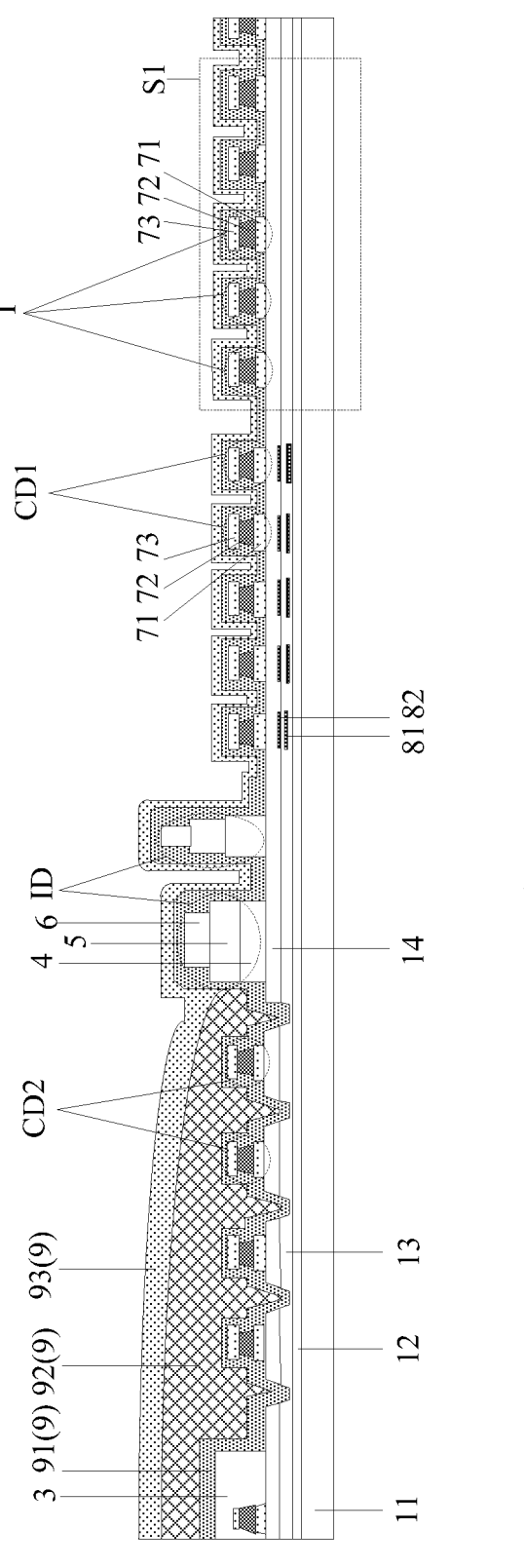
FIG. 5A is a schematic sectional view of another display panel provided by an embodiment of the present disclosure.
Figure 5B:
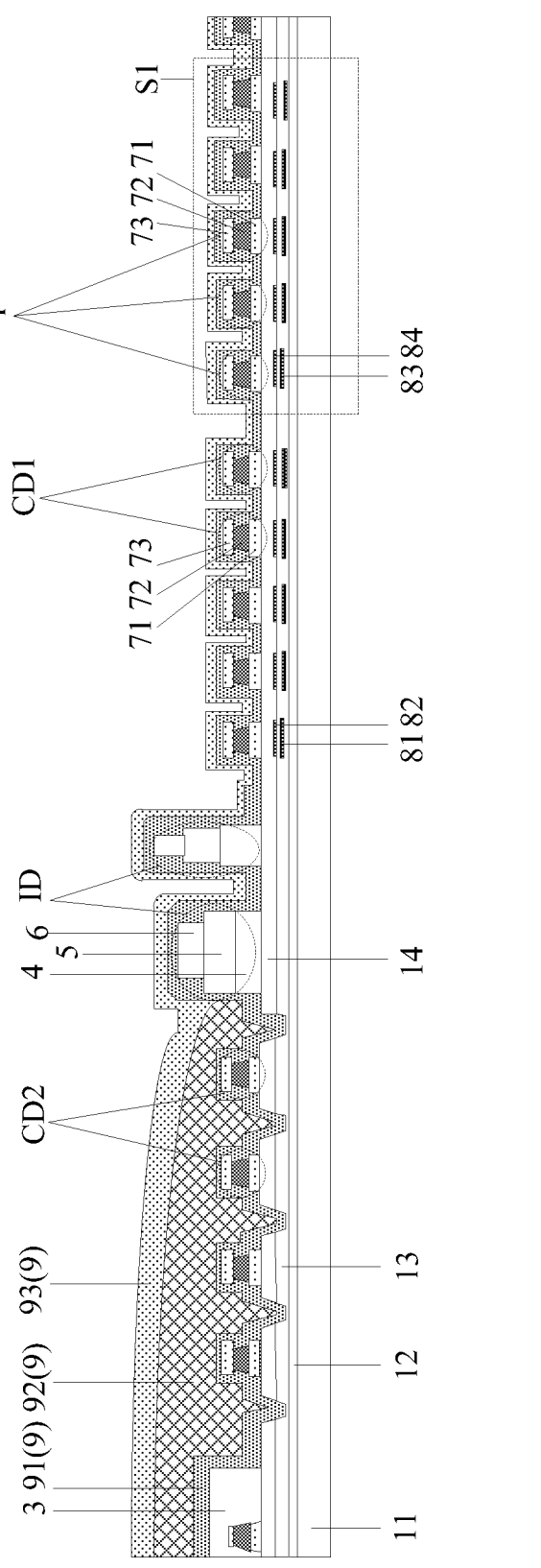
FIG. 5B is a schematic sectional view of another specific display panel provided by an embodiment of the present disclosure.

In some embodiments, with reference to FIG. 5B, a third anti-crack metal layer 83 is further arranged between at least one relief structure T and the base substrate 11, and a fourth anti-crack metal layer 84 is further arranged between the third anti-crack metal layer 83 and the relief structure T; and the third anti-crack metal layer 83 and the first anti-crack metal layer 81 are on the same layer, and the fourth anti-crack metal layer 84 and the second anti-crack metal layer 82 are on the same layer. The third anti-crack metal layer 83 and the fourth anti-crack metal layer 84 have better ductility, which may further prevent extension of the cracks.

In some embodiments, the plurality of relief structures T of the cutting residual region S1 are distributed at equal intervals. It needs to be illustrated that in the embodiment of the present disclosure, the smallest distance between the first relief structure TT of the cutting residual region S1 and the outer edge of the via hole is 0-30 micrometers. For example, the smallest distance between the first relief structure T11 and the outer edge of the via hole is 15-28 micrometers, for example, the smallest distance between the first relief structure T11 and the outer edge of the via hole is 18 micrometers, and a distance between two protrusion structures (such as two adjacent first crack dams CD1 in FIG. 2) of a non-cutting residual region is usually smaller than the smallest distance between the relief structure T and the outer edge of the via hole. For example, the distance (such as a distance between a right side face of the first crack dam CD1 from the left and a left side face of the second first crack dam CD1 from the left in the first anti-crack region S2 in FIG. 4A) between two adjacent first crack dams CD1 is 14 micrometers, and the distance (such as a distance between a right side face of the first relief structure T from the left and a left side face of the second relief structure T from the left in the cutting residual region S1 in FIG. 4A) between two adjacent relief structure T is 28 micrometers. In the embodiment of the present disclosure, the smallest distance between the first relief structure T11 and the outer edge of the via hole is 0-30 micrometers, that is, the cut position is in a region where a relief structure T with a large distance is located, which is that the relief structure T is arranged in the cutting residual region S1 (corresponding to the cutting region before cutting), and the relief structure T is not the same as the protrusion structures of the non-cutting residual region. In some embodiments, the distance between every two adjacent relief structures T of the cutting residual region S1 is greater than the protrusion structures of the non-cutting residual region, and the less quantity of relief structures T may be used to cover the cutting region.

In some embodiments, with reference to FIG. 4A, a distance k1 between every two adjacent circles of relief structures T is greater than a distance k2 between every two adjacent circles of first crack dams CD1. In some embodiments, the distance k1 between every two adjacent circles of relief structures T is twice the distance k2 between every two adjacent circles of first crack dams CD1. In the embodiment of the present disclosure, the distance k1 between every two adjacent circles of relief structures T is greater than the distance k2 between every two adjacent circles of first crack dams CD1, which may prevent that when the pixel defining layer 4 in the display panel is glued, since the relief structures T of the cutting residual region S1 are dense, it is prone to generating bubbles in the cutting residual region S1, and is not conductive to patterning the pixel defining layer 4.

In some embodiments, with reference to FIG. 4A, every two adjacent circles of relief structures T have a groove X therebetween, and the groove X extends from the packaging layer 9 to the buffer layer (the buffer layer may be a film layer in the first inorganic layer 12) and exposes part of the buffer layer.

In some embodiments, with reference to FIG. 4A, the display panel includes 3 relief structures, 5 first crack dams, 2 flow stop dams and 4 second crack dams. Of course, the quantities of the first crack dams CD1, the flow stop dams ID and the second crack dams CD2 may further be other, the adjustment of the quantities of these structures and their own deformation are all included in the design idea of this solution, and the present disclosure is not limited thereto.

In some embodiments, with reference to FIG. 4A, the display panel further includes a half-relief structure T11, and the half-relief structure T11 is located between the relief structure T and the via hole K. That is, when the via hole K is cut, the cutting position is just located at a position where the relief structure T is located, and after cutting, the half-relief structure T11 left on the display panel is formed. In some embodiments, a distance between the half-relief structure T11 and the via hole K is zero. In some embodiments, a cross-sectional area of the half-relief structure T11 in the direction perpendicular to the base substrate 11 and passing through the center of the via hole K is one half of the cross-sectional area of the relief structure T in the direction perpendicular to the base substrate 11 and passing through the center of the via hole.

In some embodiments, when the cut position is just located at the position where the relief structure T is located, the residual half of the relief structure T after cutting is also the first relief structure T11, as shown in FIG. 4A. In some embodiments, when the cutting position is located in a position between two adjacent relief structures T, a smallest distance k3 between the first relief structure T11 and the outer edge of the via hole K and a smallest distance k1 between every two adjacent relief structures T meet the following relational expression: 0<k3≤k1, as shown in FIG. 4B.

Figure 4C:
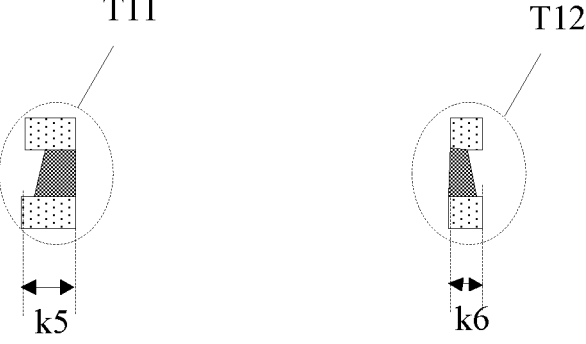
FIG. 4C is a schematic cross-sectional view of first relief structures T11 on two sides of a center of a via hole K provided by an embodiment of the present disclosure.

In some embodiments, cross-sectional largest widths of different positions of the first relief structure T11 in the direction perpendicular to the base substrate 11 and passing through the center of the via hole K are different. For example, with reference to an example shown in FIG. 4C, FIG. 4C is a schematic cross-sectional view of first relief structures T11 on two sides of a center of the via hole K, the cross section may be a cross section in a direction parallel to EF and passing through the center of the via hole K in FIG. 1, and a width K5 of the first relief structure T11 on the left side in FIG. 4C is greater than a width K6 of the first relief structure T11 on the right side in FIG. 4C. That is, during implementation of a cutting process, due to the existence of errors in the cutting process, residual parts of different positions of the first relief structure T11 may be different, resulting in the first relief structure T11 being of an asymmetric structure with respect to the center of the via hole K.

In some embodiments, with reference to FIG. 1 and FIG. 2, a plurality of circles of flow stop dams ID sequentially surrounding the first crack dams CD1 are further arranged on a side of the first crack dams CD1 facing away from the relief structure, and in a direction (as shown by an arrow AB in FIG. 2) from the flow stop dams ID pointing to the via hole K, a height of each circle of flow stop dam ID in the direction perpendicular to the base substrate 11 sequentially increases, so as to form an effect of a successively increasing blocking effect. In some embodiments, each flow stop dam ID may include a planarization layer 3, a pixel defining layer 4 and a spacer 5 which are sequentially arranged in a stacked mode, that is, when the planarization layer 3, the pixel defining layer 4 and the spacer 5 are formed, the planarization layer 3, the pixel defining layer 4 and the spacer 5 are multiplexed to form the flow stop dam ID, so as to reduce complexity of manufacturing procedures of the display panel. Of course, the flow stop dam ID may also be composed of other film layers, the quantity of the film layers constituting the flow stop dam may also be different, and the embodiment of the present disclosure is not limited thereto.

In some embodiments, with reference to FIG. 1 and FIG. 2, a plurality of circles of second crack dams CD2 sequentially surrounding the flow stop dams ID are further arranged on a side of the flow stop dams ID facing away from the first crack dams CD1; and the second crack dams CD2 may be same as the first crack dams CD1 in composition, so as to reduce the complexity of process manufacturing. In some embodiments, the second crack dams CD2 may also be same as the first crack dams CD1 in composition. Each second crack dam CD2 may include a first titanium metal layer, an aluminum metal layer and a second titanium metal layer which are sequentially stacked. The third inorganic layer 14 has a gap in a corresponding region between two adjacent second crack dams CD2, that is, the third inorganic layer 14 in the region between two adjacent second crack dams CD2 may be excavated, and the second inorganic layer 13 has a groove in a corresponding region between two adjacent second crack dams CD2, that is, part of the second inorganic layer 13 in the region between two adjacent second crack dams CD2 may be excavated.

In some embodiments, with reference to FIG. 1 and FIG. 2, the packaging layer 9 of the cutting residual region S1 includes a first inorganic packaging layer 91, and a second inorganic packaging layer 93 located on one side of the first inorganic packaging layer 91 facing away from the base substrate, and the cutting residual region S1 may be not provided with an organic packaging layer 92.

In some embodiments, with reference to FIG. 3, a side face T2 of the relief structure T is in a relief shape; and a cross-sectional shape of the relief structure T in the direction perpendicular to the base substrate 11 and passing through the center of the via hole includes a T shape. In some embodiments, the cross-sectional shape of the relief structure T in the direction perpendicular to the base substrate 11 and passing through the center of the via hole is an I shape. In some embodiments, the display panel includes signal lines; and the relief structure T and the signal lines (the signal lines may be data lines SD) are arranged on the same layer and made of the same material, and a cross-sectional shape of the signal lines may be the same as the cross-sectional shape of the relief structure T, so as to form the relief structure T while forming the signal lines. In some embodiments, in a direction perpendicular to and away from the base substrate 11, the relief structure T includes a first titanium metal layer 71, an aluminum metal layer 72 and a second titanium metal layer 73 which are sequentially arranged in a stacked mode, and a line width of the aluminum metal layer 72 is smaller than a line width of the second titanium metal layer 73. In some embodiments, the line width of the aluminum metal layer 72 may be understood as a width of the relief structure T in a direction (as shown by an arrow AB in FIG. 2) perpendicular to the base substrate 11 and pointed by the relief structure T to the via hole K. In some embodiments, with reference to FIG. 3, a cross-sectional shape of the aluminum metal layer 72 in the direction perpendicular to the base substrate 11 and passing through the center of the via hole K in the relief structure T is a trapezoid, a surface (namely an upper end face of the trapezoid) of the trapezoid facing away from the base substrate 11 is in contact with the second titanium metal layer 73, a line width of the aluminum metal layer 72 is smaller than a line width of the second titanium metal layer 73, and it may be understood that an area of a surface of the aluminum metal layer 72 facing away from the base substrate 11 is smaller than an area of a surface of the second titanium metal layer 73 facing the base substrate 11. In the embodiment of the present disclosure, the cross-sectional shape of the relief structure T in the direction perpendicular to the base substrate 11 and passing through the center of the via hole includes a T shape, a design similar to a metal buckle is formed, the metal buckle is introduced into the cutting residual region S1, in a process of film tearing (removing a protective film under the base substrate 11), the first inorganic packaging layer 91 and the second inorganic packaging layer 93 at the position of the metal buckle are deposited and attached to the surface of the relief structure T to form an inward-concave structure, so that the first inorganic packaging layer 91 and the second inorganic packaging layer 93 are buckled by the second titanium metal layer (namely Top Ti) of the metal buckle. In the process of film tearing, the first inorganic packaging layer 91 and the second inorganic packaging layer 93 are not prone to being separated from an inorganic film layer on the base substrate 11, so that the problem that the packaging layer is prone to peeling is improved.

In some embodiments, with reference to FIG. 2 or FIG. 4A, the cutting residual region S1 may only include part of the inorganic layers, for example, only include the first inorganic layer 12, the second inorganic layer 13 and the third inorganic layer 14 are removed, so as to avoid that when the cutting residual region S1 has a plurality of inorganic layers, during cutting, particles are prone to generating, which is not conducive to patterning the pixel defining layer 4. Of course, with reference to FIG. 5A, the cutting residual region S1 may include the first inorganic layer 12, and may also include the second inorganic layer 13 and the third inorganic layer 14, and packaging rings with the same heights are formed in the first anti-crack region S2 and the cutting residual region S1, which is conducive to uniformity of the packaging layer 9.

Figure 6:
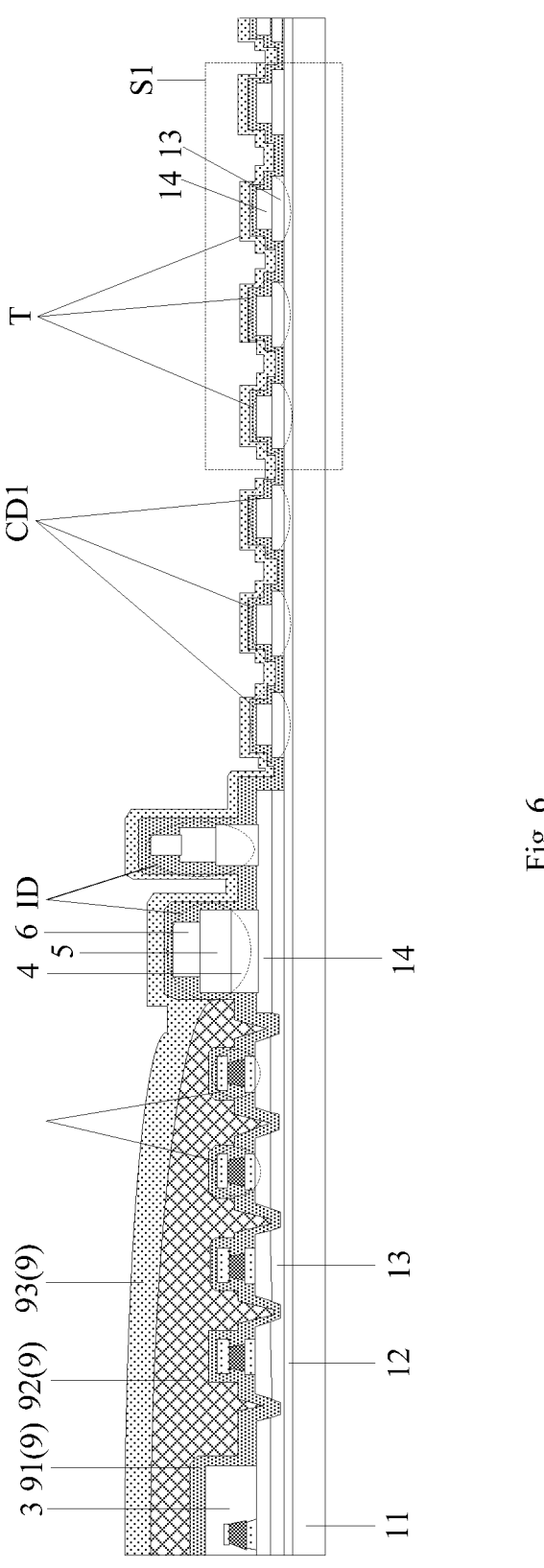
FIG. 6 is a schematic structural diagram of a relief structure being of a stepped shape provided by an embodiment of the present disclosure.
Figure 7:
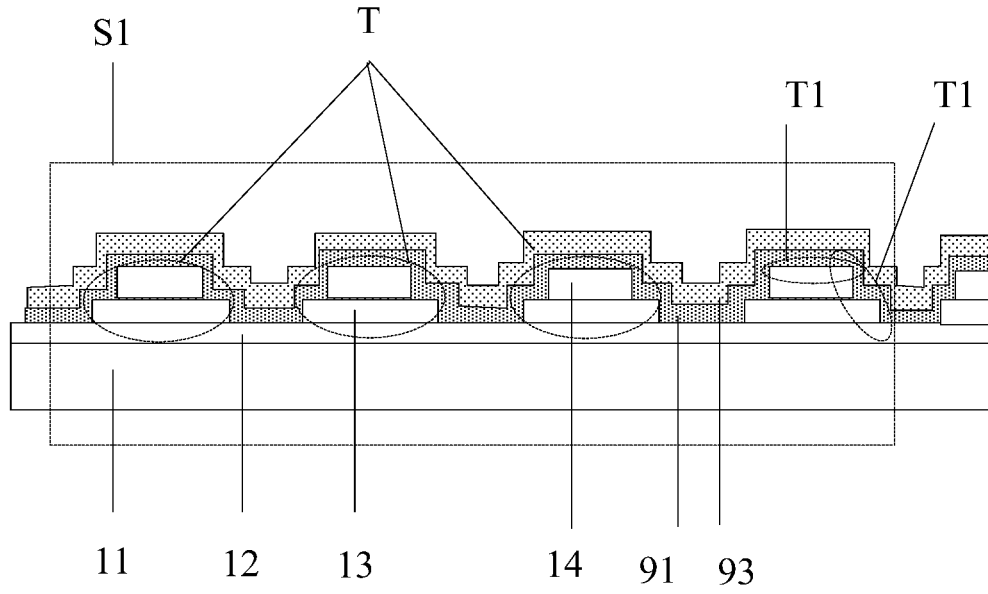
FIG. 7 is an enlarged schematic structural diagram of FIG. 6 in a cutting residual region.

In some embodiments, with reference to FIG. 6 and FIG. 7, FIG. 7 is an enlarged schematic diagram of FIG. 6 in the cutting residual region S1, and a side face T2 of the relief structure T is in the relief shape; and the cross-sectional shape of the relief structure T in the direction perpendicular to the base substrate 11 and passing through the center of the via hole includes a stepped shape. In some embodiments, each relief structure T may be composed of the second inorganic layer 13 and the third inorganic layer 14, and a line width of the second inorganic layer 13 is greater than a line width of the third inorganic layer 14. The cross section of the relief structure T shown in FIG. 7 is a two-stage step composed of two inorganic layers, but the embodiment of the present disclosure is not limited thereto, and the stepped shape may include a single-stage step and a multi-stage step (may be composed of more inorganic layers).

Figure 8:
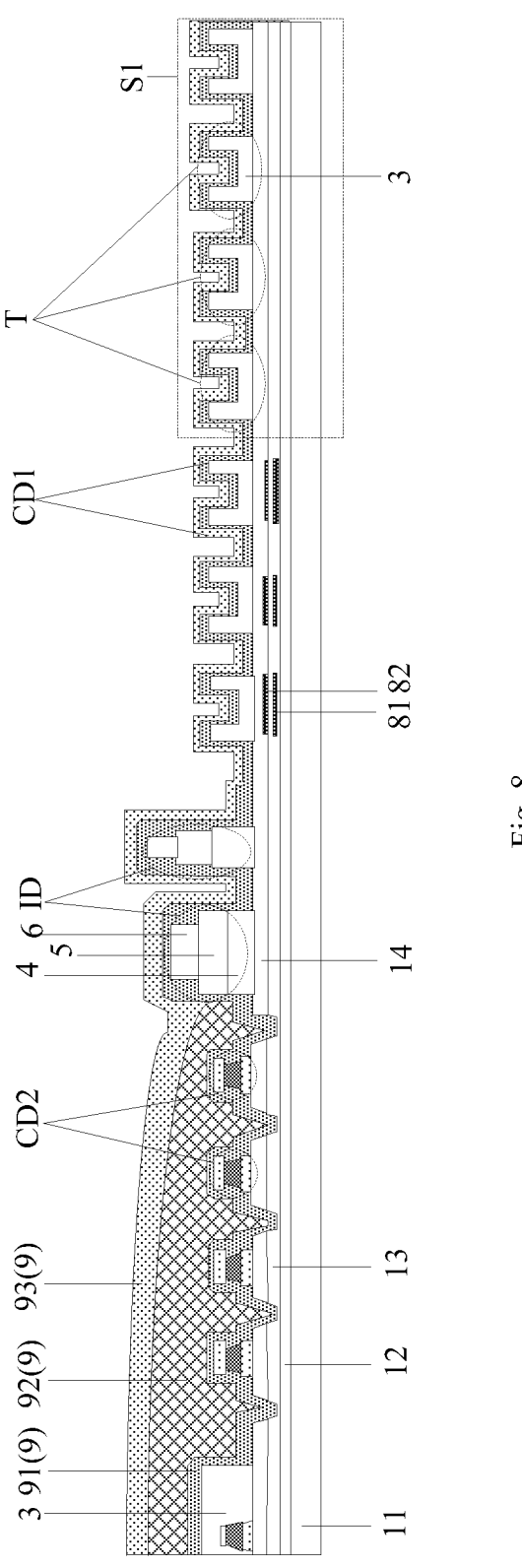
FIG. 8 is a schematic structural diagram of a relief structure being of a U shape provided by an embodiment of the present disclosure.

In some embodiments, as shown in FIG. 8, the surface T1 of the relief structure T is in the relief shape; and the cross-sectional shape of the relief structure T in the direction perpendicular to the base substrate 11 and passing through the center of the via hole includes a U shape, and the relief structure T may be composed of the planarization layer 3.

Figure 9:
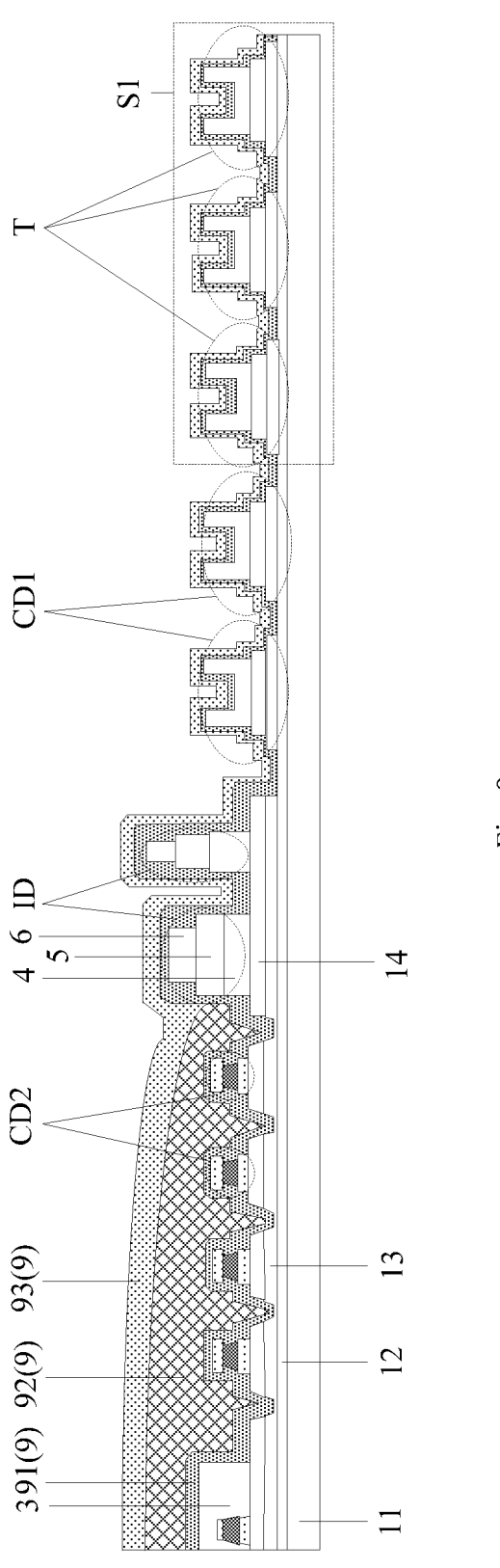
FIG. 9 is a schematic structural diagram of a relief structure including a stepped shape and a U shape provided by an embodiment of the present disclosure.

In some embodiments, the cross-sectional shape of the relief structure T in the direction perpendicular to the base substrate 11 and passing through the center of the via hole may only include the U shape, as shown in FIG. 8; may also only include the I shape, as shown in FIG. 2; may also only include the stepped shape, as shown in FIG. 6; may also include the stepped shape and the U shape at the same time, as shown in FIG. 9, where the structure of the stepped shape may be composed of the second inorganic layer 13 and the third inorganic layer 14, and the structure of the U shape may be composed of the planarization layer 3; and may also include the I shape and the U shape at the same time. When the relief structure T includes a plurality of shape structures, the plurality of shape structures may be sequentially stacked in the direction perpendicular to the base substrate 11.

Figure 10:
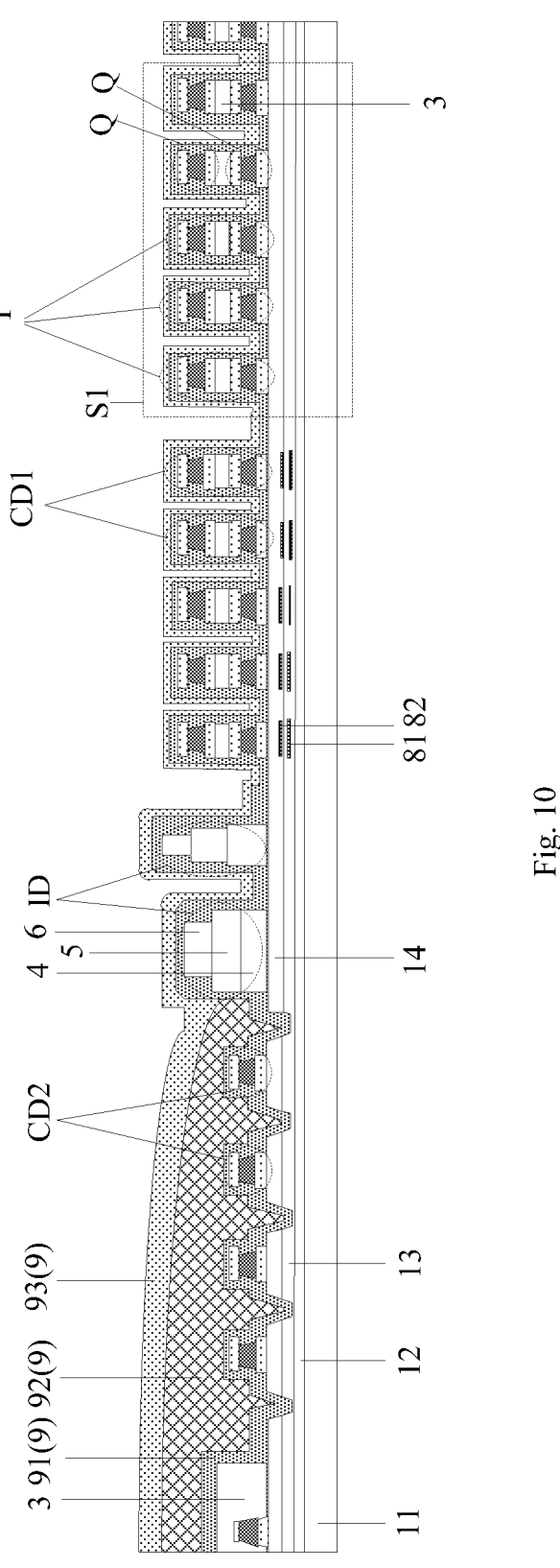
FIG. 10 is a schematic structural diagram of a relief structure including two repetition structures provided by an embodiment of the present disclosure.
Figure 11:
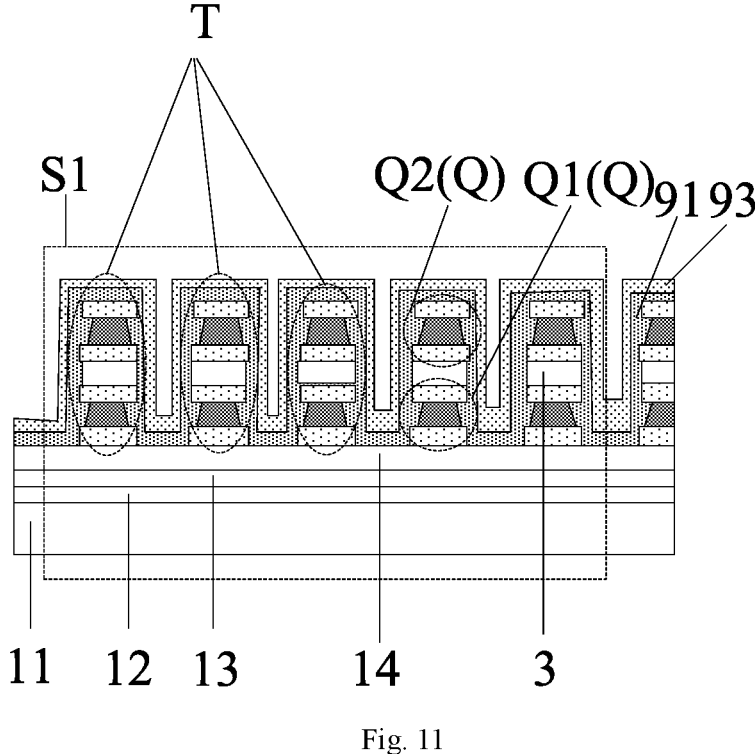
FIG. 11 is an enlarged schematic structural diagram of FIG. 10 in a cutting residual region.

In some embodiments, with reference to FIG. 10 and FIG. 11, FIG. 11 is an enlarged schematic diagram of FIG. 10 in the cutting residual region S1, in the direction perpendicular to the base substrate 11, the relief structure T includes at least one repetition structure Q, the at least one repetition structure Q is sequentially arranged in a stacked mode, and cross-sectional shapes of different repetition structures Q in the direction perpendicular to the base substrate 11 and passing through the center of the via hole are the same. In some embodiments, with reference to FIG. 11, the relief structure T includes a plurality of repetition structures Q, and a planarization layer 3 is further arranged between every two adjacent repetition structures Q. In some embodiments, each repetition structure Q shown in FIG. 11 is of the I shape, so as to have greater contact areas with the packaging layer 9. In some embodiments, each repetition structure Q may include a first titanium metal layer, an aluminum metal layer and a second titanium metal layer which are sequentially stacked.

Figure 12:
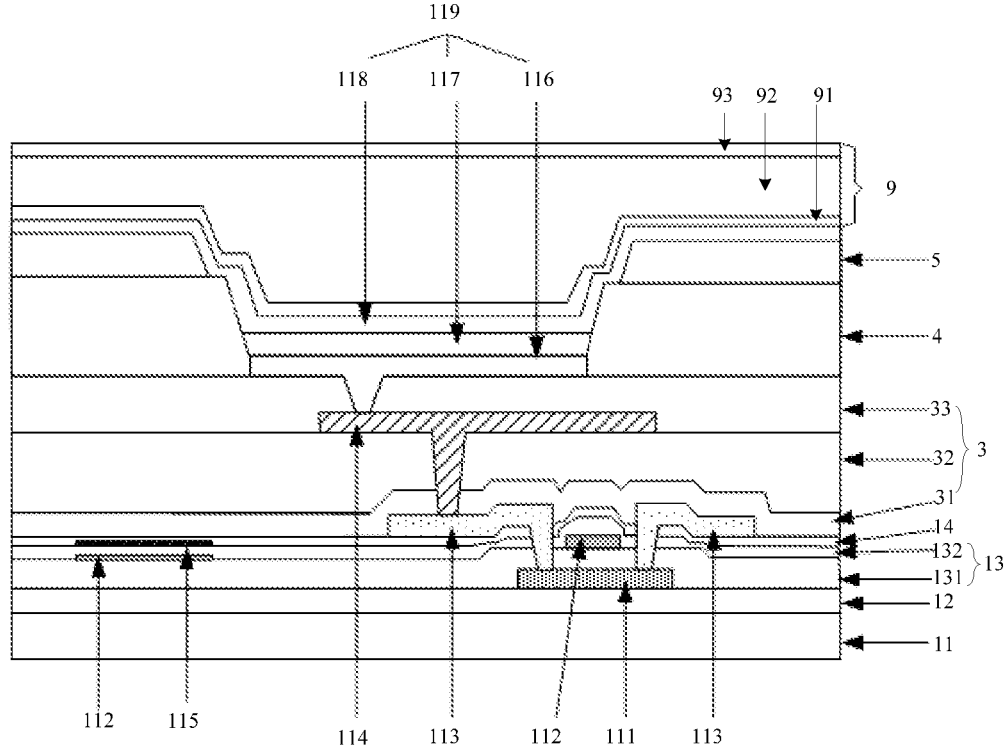
FIG. 12 is a schematic sectional view of a display region of a display panel provided by an embodiment of the present disclosure.

In some embodiments, with reference to FIG. 12, the display region AA may include a barrier layer, a buffer layer (the barrier layer and the buffer layer are used as a first inorganic layer 12), an active layer 111, a first gate insulating layer 131, a first gate metal layer 112, a second gate insulating layer 132 (the first gate insulating layer 131 and the second gate insulating layer 132 may be used as a second inorganic layer 13), a second gate metal layer 115, an interlayer dielectric layer ILD (the interlayer dielectric layer ILD may be used as a third inorganic layer 14), a first source-drain layer 113, a passivation layer 31, a first planarization layer 32, a second source-drain layer 114, a second planarization layer 33 (the passivation layer 31, the first planarization layer 32 and the second planarization layer 33 may be used as a planarization layer 3), a pixel electrode 116, a pixel defining layer 4, a spacer 5, a light emitting layer 117, a cathode 118, a first inorganic packaging layer 91, an organic packaging layer 92 and a second inorganic packaging layer 93 which are sequentially located on one side of the base substrate 11.

In some embodiments, with reference to FIG. 2, FIG. 4A and FIG. 4B, the first crack dams CD1 and the relief structure T may be arranged on the same layer and made of the same material. In some embodiments, the first crack dams CD1 and the relief structure T may all be arranged on the same layer and made of the same material as the first source-drain layer 113 or the second source-drain layer 114, and may all include the first titanium metal layer, the aluminum metal layer and the second titanium metal layer which are sequentially arranged in a stacked mode. Similarly, the second crack dams CD2 and the relief structure T may be arranged on the same layer and made of the same material. In some embodiments, the second crack dams CD2 and the relief structure T may all be arranged on the same layer and made of the same material as the first source-drain layer 113 or the second source-drain layer 114, and may all include the first titanium metal layer, the aluminum metal layer and the second titanium metal layer which are sequentially arranged in a stacked mode. It needs to be illustrated that, "arranged on the same layer" used in the present disclosure refers to a structure formed by two (or more than two) structures formed through the same deposition process and patterned through the same patterning process, and their materials may be the same or different. For example, materials used to form precursors of various structures arranged on the same layer are the same, and the finally formed materials may be the same or different. "Integrated structure" used in the present disclosure refers to a structure formed by two (or more than two) structures formed through the same deposition process and patterned through the same patterning process, which are connected to each other, and their materials may be the same or different.

In some embodiments, in the direction perpendicular to the base substrate 11, each relief structure T may include two repetition structures Q, the two repetition structures Q may be a first repetition structure Q1 and a second repetition structure Q2 located on one side of the first repetition structure Q facing away from the base substrate 11, the first repetition structure Q1 and the first source-drain layer may be on the same layer, and when the first source-drain layer is manufactured, the first repetition structure Q1 is formed at the same time; and the second repetition structure Q2 and the second source-drain layer 113 may be on the same layer, and when the second source-drain layer is manufactured, the second repetition structure Q2 is formed at the same time. In some embodiments, in the direction perpendicular to the base substrate 11, the relief structure T only includes one repetition structure Q (such as the relief structure T as shown in FIG. 5A), the repetition structure Q and the first source-drain layer may be on the same layer, or the repetition structure Q and the second source-drain layer may be on the same layer.

In some embodiments, the relief structure T may be composed of one or a combination of the barrier layer, the buffer layer, the first gate insulating layer, the second gate insulating layer, the interlayer dielectric layer, the first planarization layer, the second planarization layer and the pixel defining layer. Each first crack dam CD1 may be composed of one or a combination of the barrier layer, the buffer layer, the first gate insulating layer, the second gate insulating layer, the interlayer dielectric layer, the first planarization layer, the second planarization layer and the pixel defining layer. The first crack dams CD1 may be the same as the relief structure T in composition, so as to reduce the complexity of the manufacturing procedure of the display panel; and the first crack dams CD1 may also be different from the relief structure T in composition.

Figure 13:
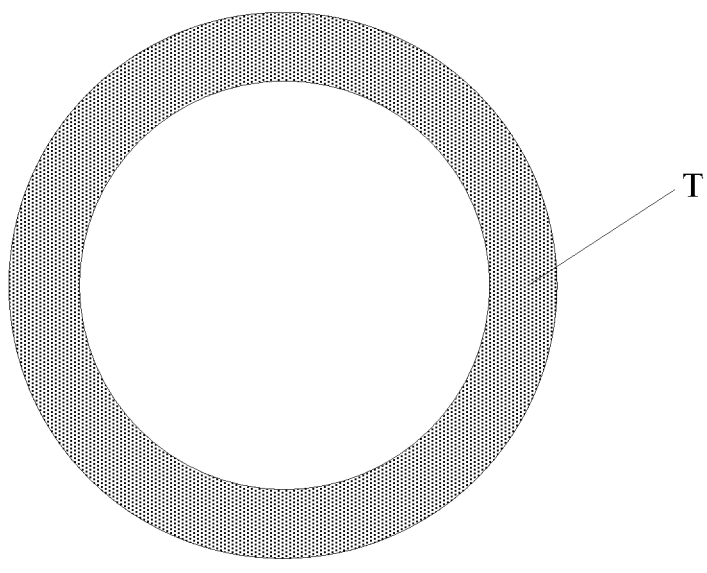
FIG. 13 is a schematic top view of a relief structure provided by an embodiment of the present disclosure.

In some embodiments, with reference to FIG. 13, each relief structure T is of an integrated structure, that is, a projection of each relief structure T on the base substrate 11 is a complete circular ring.

Figure 14:
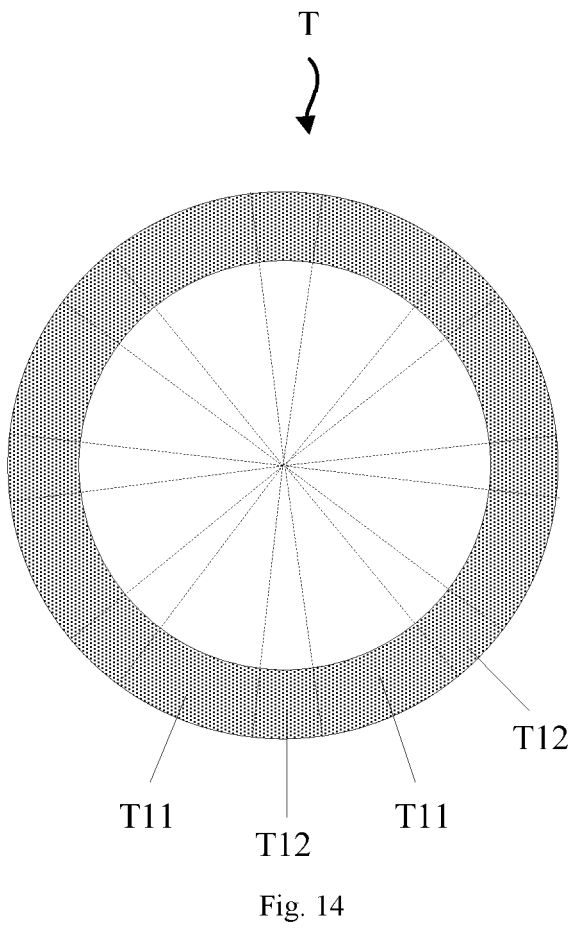
FIG. 14 is a schematic top view of another relief structure provided by an embodiment of the present disclosure.

In some embodiments, with reference to FIG. 14, each relief structure T includes a plurality of entity parts T11 and a plurality of excavation parts T12, and the entity parts T11 and the excavation parts T12 are arranged alternately; and all the entity parts T11 in the same relief structure T have the same center of circle. In the embodiment of the present disclosure, through division design of the relief structure T, a bonding strength between the packaging layer 9 and the relief structure T may be further enhanced, and the larger the number of divisions of the relief structure T, the larger the contact area with the packaging layer 9. However, the specific number of divisions depends on a process level. As shown by a dotted line in FIG. 13, extension lines of the entity parts T11 in the relief structure T intersect with the center of the circular ring.

An embodiment of the present disclosure further provides a display device, including the display panel provided by the embodiment of the present disclosure.

In the embodiment of the present disclosure, the cutting residual region S1 is provided with at least one circle of relief structure T distributed around the via hole K, at least one of the surface T1 of the relief structure T facing away from the base substrate 11 or the side face T3 is in the relief shape, which may increase a contact area between the relief structure T and the packaging layer 9, enhance a bonding strength of the packaging layer and improve the problems that in a manufacturing process of a hole digging screen, due to stress imbalance of the packaging layer at the cutting region, and a thermal effect generated by laser cutting amplifies the stress, which is prone to causing peeling of the packaging layer, resulting in poor packaging, thereby reducing a production yield of products.

The display panel provided by the embodiment of the present disclosure may be an organic light emitting diode (OLED) display panel and a quantum-dot light emitting diode (QLED) display panel. Other essential components of the display panel should be understood by those ordinarily skilled in the art, and are not repeated here, nor should they be used as a limitation to the present disclosure. Since the principle for solving problems of the display panel is similar to that of the above display substrate, implementation of the display panel provided by the embodiment of the present disclosure may refer to implementation of the above display substrate provided by the embodiment of the present disclosure, and repetitions will not be made.

An embodiment of the present disclosure further provides a display device, including the display panel provided by the embodiment of the present disclosure. The display device may be: a mobile phone, a tablet computer, a television, a display, a laptop, a digital photo frame, a navigator, a smart watch, a fitness wrist strap, a personal digital assistant and any product or component with a display function. Other essential components of the display device should be understood by those ordinarily skilled in the art, and are not repeated here, nor should they be used as a limitation to the present disclosure. In addition, since the principle for solving problems of the display device is similar to that of the above display panel, implementation of the display device may refer to embodiments of the above display panel, and repetitions will not be made.

Although the preferred embodiments of the present disclosure have been described, those skilled in the art can make additional changes and modifications on these embodiments once they know the basic creative concept. So the appended claims are intended to include the preferred embodiments and all changes and modifications that fall into the scope of the present disclosure.

Apparently, those skilled in the art may perform various changes and modifications on the embodiments of the present disclosure without departing from the spirit and scope of the embodiments of the present disclosure. Therefore, if these changes and modifications on the embodiments of the present disclosure fall in the scope of the claims of the present disclosure and their equivalent technologies, the present disclosure is intended to include these changes and modifications.

What is claimed is:

1. A display panel, comprising:

a via hole, penetrating through the display panel;

a cutting residual region, located on a periphery of the via hole and comprising: a base substrate, and a packaging layer on a side of the base substrate; and at least one circle of relief structure, arranged between the packaging layer and the base substrate in the cutting residual region;

wherein the at least one circle of relief structure is distributed around the via hole;

a smallest distance between a first relief structure and an outer edge of the via hole ranges from 0 to 30 micrometers;

at least one relief structure is provided with a surface facing away from the base substrate, and a side face connected to the surface, at least one of the surface or the side face is in a relief shape; and the first relief structure is a relief structure with a smallest distance from a center of the via hole;

the display panel further comprises: a display region located on a side of the cutting residual region facing away from the via hole;

wherein the display region comprises a barrier layer, a buffer layer, an active layer, a first gate insulating layer, a first gate metal layer, a second gate insulating layer, a second gate metal layer, an interlayer dielectric layer, a first source-drain layer, a first planarization layer, a second source-drain layer, a second planarization layer and a pixel defining layer which are sequentially arranged on a side of the base substrate;

wherein a plurality of circles of first crack dams are further arranged on a side of the relief structure facing away from the via hole;

the first crack dams are arranged between the base substrate and the packaging layer; and the plurality of circles of first crack dams are sequentially arranged around the relief structure;

wherein a first anti-crack metal layer is further arranged between the at least one first crack dam and the base substrate; and a second anti-crack metal layer is further arranged between the first anti-crack metal layer and the first crack dam;

the first anti-crack metal layer and the first gate metal layer are on a same layer, and the second anti-crack metal layer and the second gate metal layer are on a same layer.

2. The display panel according to claim 1, wherein the side face is in the relief shape; and a cross-sectional shape of the relief structure in a direction perpendicular to the base substrate and passing through the center of the via hole comprises a T shape; or the side face is in the relief shape; and a cross-sectional shape of the relief structure in a direction perpendicular to the base substrate and passing through the center of the via hole comprises a stepped shape; or the surface is in the relief shape; and the cross-sectional shape of the relief structure in the direction perpendicular to the base substrate and passing through the center of the via hole comprises a U shape.

3. The display panel according to claim 1, wherein in a direction perpendicular to the base substrate, the relief structure comprises at least one repetition structure, and the at least one repetition structure is sequentially arranged in a stacked mode.

4. The display panel according to claim 3, wherein the relief structure comprises a plurality of repetition structures, and a planarization layer is further arranged between two adjacent repetition structures;

cross-sectional shapes of different repetition structures in a direction perpendicular to the base substrate and passing through the center of the via hole are same.

5. The display panel according to claim 1, wherein the relief structure is composed of one or a combination of: the barrier layer, the buffer layer, the first gate insulating layer, the second gate insulating layer, the interlayer dielectric layer, the first planarization layer, the second planarization layer and the pixel defining layer.

6. The display panel according to claim 1, wherein a third anti-crack metal layer is further arranged between the at least one relief structure and the base substrate, and a fourth anti-crack metal layer is further arranged between the third anti-crack metal layer and the relief structure; and the third anti-crack metal layer and the first anti-crack metal layer are on a same layer, and the fourth anti-crack metal layer and the second anti-crack metal layer are on a same layer.

7. The display panel according to claim 1, wherein a distance between two adjacent circles of relief structures is twice a distance between two adjacent circles of first crack dams.

8. The display panel according to claim 1, wherein two adjacent circles of relief structures have a groove therebetween, and the groove extends from the packaging layer to the buffer layer and exposes part of the buffer layer.

9. The display panel according to claim 8, wherein a smallest distance k3 between the first relief structure and the outer edge of the via hole and a smallest distance k1 between two adjacent relief structures meet following relational expression:

$$0 < k3 \leq k1.$$

10. The display panel according to claim 1, wherein a plurality of circles of flow stop dams sequentially surrounding the first crack dams are further arranged on a side of the first crack dams facing away from the relief structure; and in a direction from the flow stop dams pointing to the via hole, a height of each circle of flow stop dam in a direction perpendicular to the base substrate sequentially increases.

11. The display panel according to claim 10, wherein a plurality of circles of second crack dams sequentially surrounding the flow stop dams are further arranged on a side of the flow stop dams facing away from the first crack dams; and the second crack dams are same as the first crack dams in composition.

12. The display panel according to claim 11, further comprising a half-relief structure, wherein the half-relief structure is located between the relief structure and the via hole;

largest cross-sectional widths of the first relief structure at different positions in a direction perpendicular to the base substrate and passing through the center of the via hole are different; or a smallest distance between the half-relief structure and the outer edge of the via hole is zero; or a cross-sectional area of the half-relief structure in a direction perpendicular to the base substrate and passing through the center of the via hole is one half of a cross-sectional area of the relief structure in the direction perpendicular to the base substrate and passing through the center of the via hole.

13. The display panel according to claim 1, wherein in a direction perpendicular to the base substrate, the relief structure comprises one repetition structure; and the repetition structure and the first source-drain layer are on a same layer, or the repetition structure and the second source-drain layer are on a same layer; or in a direction perpendicular to the base substrate, the relief structure comprises two repetition structures, the two repetition structures are a first repetition structure and a second repetition structure, the second repetition structure arranged on a side of the first repetition structure facing away from the base substrate; and the first repetition structure and the first source-drain layer are on a same layer, and the second repetition structure and the second source-drain layer are on a same layer.

14. The display panel according to claim 13, wherein in the direction perpendicular to the base substrate, the relief structure comprises: a first titanium metal layer, an aluminum metal layer and a second titanium metal layer which are sequentially arranged in a stacked mode, and a line width of the aluminum metal layer is smaller than a line width of the second titanium metal layer.

15. The display panel according to claim 1, wherein each relief structure is an integrated structure.

16. A display device, comprising the display panel according to claim 1.

* * * * *